United States Patent [19]
Pai et al.

[11] Patent Number: 5,746,367
[45] Date of Patent: May 5, 1998

[54] METHOD AND APPARATUS TO WICK SOLDER FROM CONDUCTIVE SURFACES

[75] Inventors: Deepak Keshav Pai, Burnsville; Lowell Dennis Lund, Eden Prairie, both of Minn.

[73] Assignee: Ceridan Corporation, Bloomington, Minn.

[21] Appl. No.: 629,280

[22] Filed: Apr. 8, 1996

[51] Int. Cl.⁶ ........................................ B23K 3/00
[52] U.S. Cl. .............................................. 228/19
[58] Field of Search ................... 228/35, 19; 439/83, 439/874, 876

[56] References Cited

U.S. PATENT DOCUMENTS

| | | | |
|---|---|---|---|
| Re. 32,086 | 2/1986 | Spirig | 228/19 |
| 3,434,455 | 3/1969 | Maytone | 118/72 |
| 3,627,191 | 12/1971 | Hood, Jr. | 228/19 |
| 4,934,582 | 6/1990 | Bertram et al. | 228/191 |
| 5,072,874 | 12/1991 | Bertram et al. | 228/264 |
| 5,083,698 | 1/1992 | Forsha | 228/160 |
| 5,094,139 | 3/1992 | Forsha | 87/9 |
| 5,284,286 | 2/1994 | Brofman et al. | 228/19 |
| 5,305,941 | 4/1994 | Kent et al. | 228/19 |

*Primary Examiner*—Samuel M. Heinrich
*Attorney, Agent, or Firm*—Kinney & Lange

[57] ABSTRACT

A system for removing solder from an area grid array pad by applying a wire mesh to a conductive surface of the area grid array that is covered with solder. Heat is applied to the wire mesh and the conductive surface of the area grid array so that the solder flows from the conductive surface onto the wire mesh. The wire mesh is removed from the conductive surface thereby removing all solder from the conductive surface of the area grid array.

10 Claims, 3 Drawing Sheets

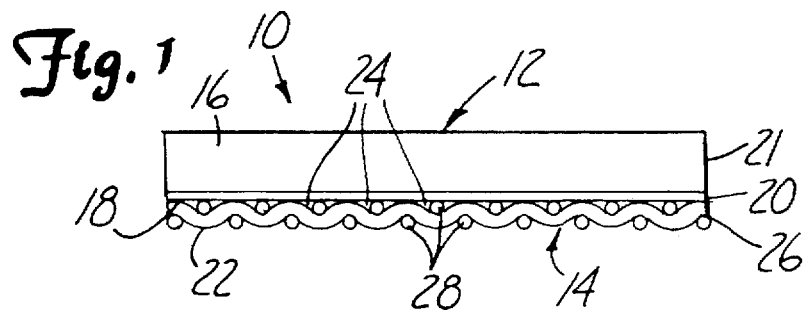
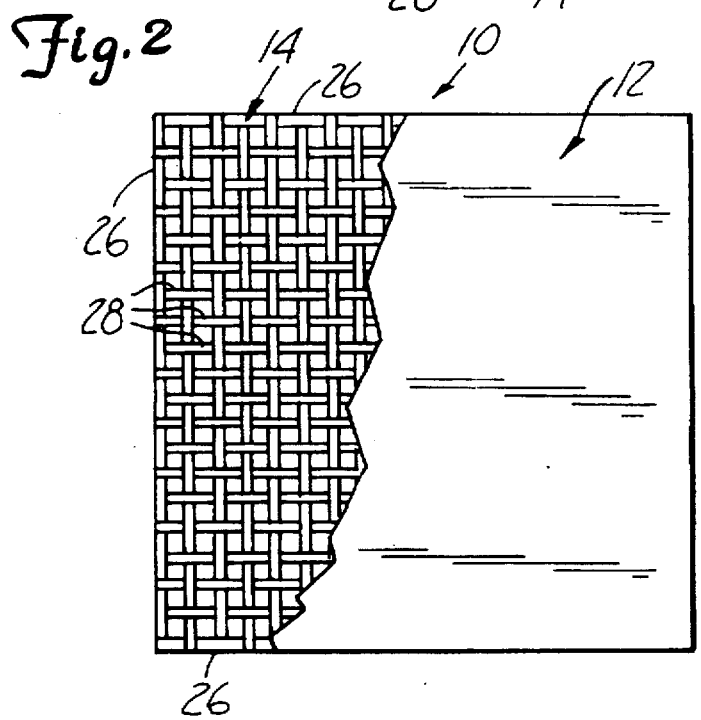
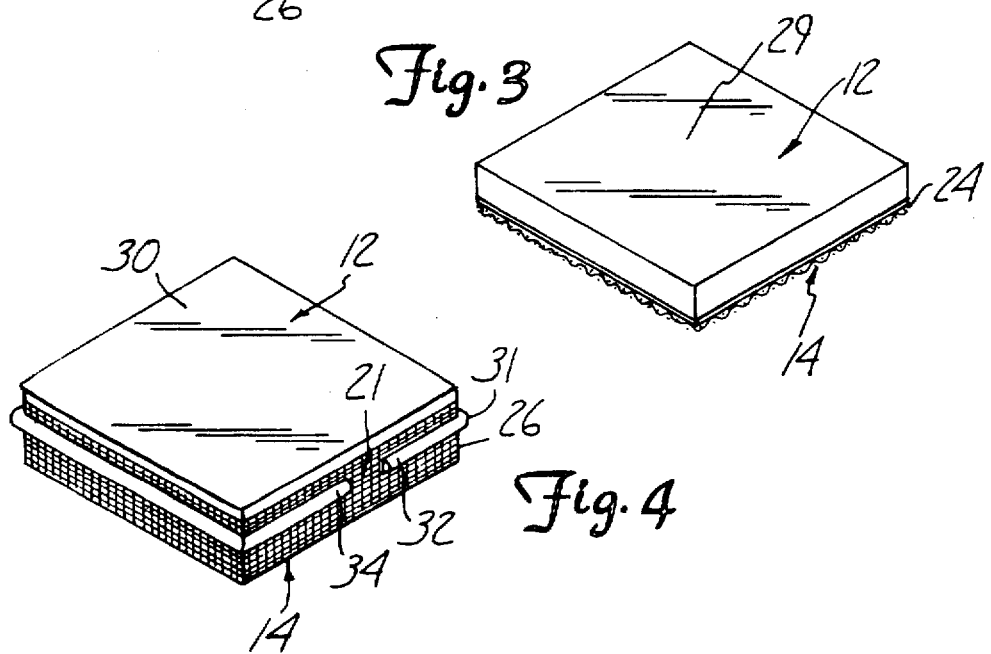

METHOD AND APPARATUS TO WICK SOLDER FROM CONDUCTIVE SURFACES

FIELD OF THE INVENTION

The present invention relates to devices for removing solder from conductive surfaces of microelectronic components.

BACKGROUND OF THE INVENTION

It is frequently desirable to remove solder from conductive surfaces of a microelectronic component or printed wire board. This solder removal can occur during a process of removing a microelectronic component from another structure such as a printed wire board. Conventional methods of removing solder from a conductive surface of a printed wire board include the use of a wick and a heated solder tip to cause solder to flow off the conductive surface onto the wick. This technique must be performed manually for each conductive surface on the printed wire board. The solder must be completely removed from the conductive surfaces of the printed wire board so that another microelectronic component can be later mounted on this conductive surface. The removal of solder must be thorough to avoid electrical connection problems caused by solder residue left over from the connection of the original microelectronic component on the printed wire board.

A conductive mounting surface of a printed wire board typically has a large array of conductive surface pads (e.g. 50, 100, or even 400) which are spaced apart about 0.050 inches. Manually removing solder from each of these conductive surface pads using a heated solder tip and a conventional wick is very time-consuming and therefore costly due to the manual labor required. In addition, due to a large number of conductive surface pads to be cleaned, the quality and reliability of removing solder in this manner is inadequate. Moreover, with the continual improvements in the performance of area grid array semiconductor chips, and the increasing prevalence of area grid array semiconductor chips, it is highly desirable to better facilitate removal and replacement of an area grid array chip on a printed wire board.

SUMMARY OF THE INVENTION

A method of the present invention removes solder from a plurality of conductive surfaces on a microelectronic component or a printed wire board. This method can remove solder from each of these conductive surfaces simultaneously thereby significantly reducing the time required to remove solder and significantly improving the quality and reliability of electrical connections made later on the conductive surfaces.

A method of the present invention removes solder from a plurality of conductive surfaces of a microelectronic component or a printed wire board by applying a wire fabric onto the solder on the conductive surfaces of the component. Heat is applied to the wire fabric and the conductive surfaces so that the solder flows off the conductive surfaces and onto the wire fabric. The wire fabric is removed from the conductive surfaces thereby removing all solder from the conductive surfaces of the microelectronic component or printed wire board.

BRIEF DESCRIPTION OF THE DRAWINGS

FIG. 1 is a side view of a wicking system of the present invention.

FIG. 2 is a top plan view in elevation of the wicking system with a portion broken away to illustrate a metal cloth fabric of the wicking system.

FIG. 3 is a perspective view of a wicking system of the present invention.

FIG. 4 is a perspective view of an alternative embodiment of a wicking system of the present invention

DETAILED DESCRIPTION OF THE PREFERRED EMBODIMENTS

Figure 5:
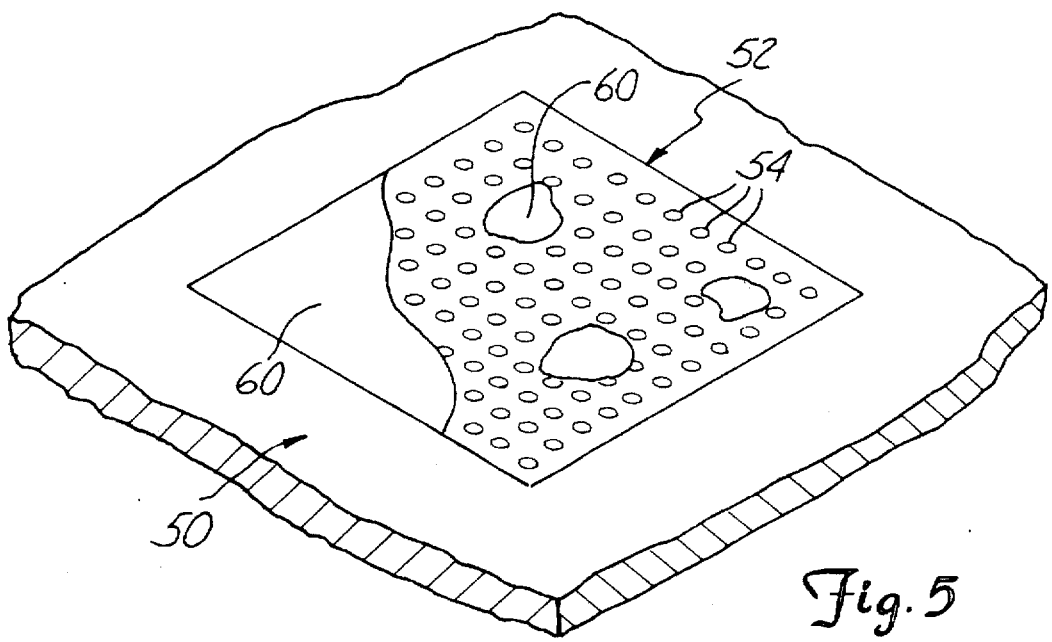
FIG. 5 is a perspective view of a printed wire board with solder residue remaining on a conductive surface of the board.

A solder removing system of the present invention is shown generally in FIGS. 1 and 2 at 10. The system 10 includes a carrier 12 and a wicking fabric 14. The carrier 12 has a first surface 16, a second surface 18, an outer edge 20, and sides 21. The wicking fabric 14 has a first surface 22, a second surface 24, an outer edge 26, and is made of a wire 28.

In a preferred embodiment (FIG. 3), the carrier 12 is made of an epoxy glass laminate 29 having a thickness of about 0.015 to 0.100 inches. In this embodiment, the carrier 12 is bonded to the second surface 24 of the wicking fabric 14, with either a high temperature solder or an adhesive. The fabric 14 has a surface area between its outer edges that matches the shape and size of the laminate carrier 12 so that outer edges 26 of the fabric 14 do not extend beyond, and are coterminus with, outer edges 20 of the carrier 12. The second surface 18 of the carrier 12 and the second surface 24 of the metal fabric 14 are sized and shaped to reciprocally match the shape and size of an array of conductive surface pads on a printed wire board or other microelectronic component.

In an alternate embodiment (FIG. 4), the carrier 12 is made of a ceramic or metal material 30. In this embodiment, the wicking fabric 14 is sized and shaped so that its outer edges 26 extend beyond the outer edge 20 of the carrier 12 so that outer edges 26 of the fabric can be wrapped upwardly around and onto the sides 21 of the carrier 12. The outer edges 26 of the fabric 14 are secured relative to the sides 21 of the carrier 12 with a clip-on retainer 31 having a first end 32 and a second end 34. The clip-on retainer 31 is a bendable resilient metal member capable of releasably holding the outer edges 26 of the fabric 14 securely against the sides 21 of the carrier 12 by the tendency of the retainer 30 to hold the shape shown in FIG. 4. The second surface 18 of the carrier 12 and the second surface 24 of the metal fabric (excluding the outer edge portion wrapped about the sides 21 of the carrier 12) are sized and shaped to reciprocally match the shape and size of an array of conductive surface pads on a printed wire board or other microelectronic component.

The wire 28 of the fabric 14 is preferably a metal material and has a diameter of about 0.002 to 0.020 inches. The fabric 14 is woven to form openings of about 0.002 inches to 0.040 inches between respective wires 28. The wire 28 is preferably made of copper but can alternatively be made of almost any metal. The wire 28 is preferably coated with a copper and tin:lead alloy or an organic protective coating.

The solder wicking system 10 of the present invention is preferably used to remove solder from a printed wire board portion illustrated in FIG. 5 at 50. The printed wire board 50 includes a connecting surface 52 with a plurality of conductive surface pads 54. Typically, an area grid array (AGA) semiconductor chip is mounted on the connecting surface 52 with solder forming the connection between the conductive pads 54 of the printed wire board 50 and reciprocal conductive surface pads on the AGA chip. When an AGA chip is removed from the connecting surface 52 of the printed wire board 50, solder 60 is left as a residue on the connecting surface 52 as shown in FIG. 5. The solder 60 can be spread over the surface 52 or still remain in the shape of balls on individual conductive surface pads 54. Since the AGA chip is removed for the purpose of replacing the AGA chip with another microelectronic component, the solder 60 must be completely removed from the connecting surface 52 of the printed wire board 50 to insure a reliable electrical and mechanical connection of the new AGA chip on the printed wire board 50.

To remove the solder 60 from the printed wire board 50, the printed wire board 50 is first baked at about 90° C. to 110° C. for about 4 hours to remove all excess moisture from the printed wire board 50. This step prevents bubbling of the surface of the printed wire board 50 due to moisture when the board 50 is exposed to much higher temperatures. This elevated temperature of the printed wire board 50 is maintained throughout the remainder of the method described below.

Figure 6:
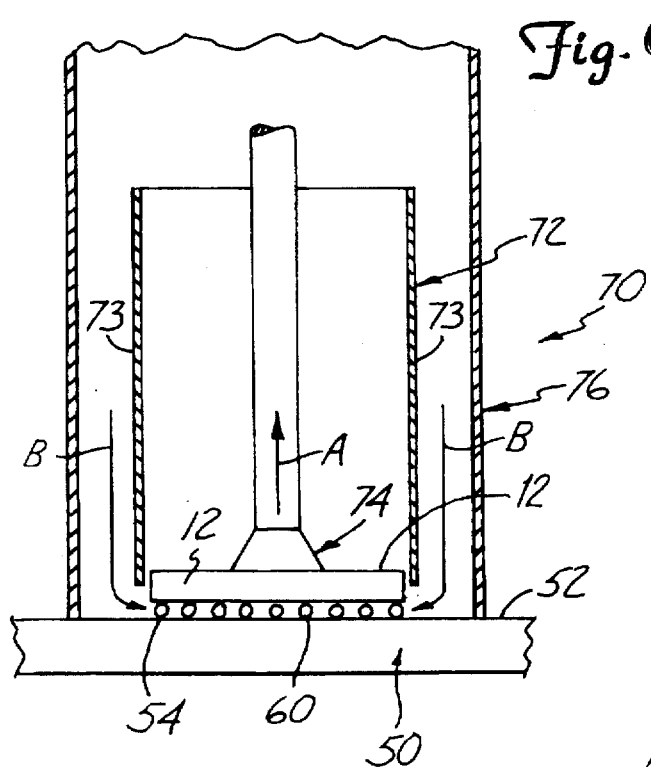
FIG. 6 is a side plan view of an hot gas rework nozzle in use with a wicking system of the present invention.

Second, flux is applied to the metal fabric 14 of the wicking system 10. Flux can also be applied to the connecting surface 52 of the printed wire board 50. As shown in FIG. 6, a hot gas rework system 70 includes a vacuum system 72 having walls 73 and a vacuum nozzle 74 and also includes a hot gas nozzle 76. The vacuum system 72 is sized and shaped to fit closely about the connecting surface 52 of the printed wire board 50, as shown in FIG. 6. The vacuum nozzle 74 is activated at a location remote from the printed wire board 50 and positioned to releasably hold the carrier 12 of the wicking system 10 by a vacuum force (identified by the arrow A). The rework system 70 including the vacuum system 72 is then moved onto the board 50 with the vacuum nozzle 74 directing the metal fabric 14 onto the printed wire board 50 into the position shown in FIG. 6 so that the metal fabric 14 is in contact with the solder 60 covering the conductive surface pads 54 of the connecting surface 52. The hot gas nozzle 76 of the rework system 70 is then activated and causes hot gas (identified by the arrows B) to flow around the metal fabric 14 to heat the metal fabric 14 and the solder 60 to a temperature of about 240° C. whereby the solder 60 flows onto and adheres to the metal fabric 14. While the metal fabric 14 is still hot, the rework system 70 is moved away from the surface of the printed wire board 50 causing the vacuum nozzle 74 to remove the wicking system 10 from the connecting surface 52 of the printed wire board 50. Any excess solder 60 that has not flowed onto the metal fabric 14 by that time will then wick onto the metal fabric 14 because of the surface tension of the solder as the metal fabric 14 is moved away from the connecting surface 52. In a final step, the combined assembly of the laminate carrier 12 and metal fabric 14 is removed from the rework system 70 (by deactivation of the vacuum nozzle 74) to permit installation of a new working system for future use. In this embodiment, use of the laminate carrier 12 (FIG. 3) is preferred since the laminate carrier 12 and fabric 14 can simply be discarded instead of having to remove the metal fabric 14 from the carrier 12, as would be required with the embodiment of FIG. 4 which requires manipulation of the retainer clip 31.

While a method of removing solder has been described for removing solder from a connecting surface 52 of a printed wire board 50, this method can also be employed to remove solder from a surface of a microelectronic component such as an area grid array (AGA) chip having an array of conductive pads similar to the array of conductive pads 52 of the printed wire board shown in FIG. 5. Both the wicking systems shown in FIG. 3 and 4 are suitable for use with the method described in association with FIGS. 5 and 6, which employs hot gas flow to cause reflowing of solder 60 onto the metal fabric 14 of the wicking system 10.

Figure 7:
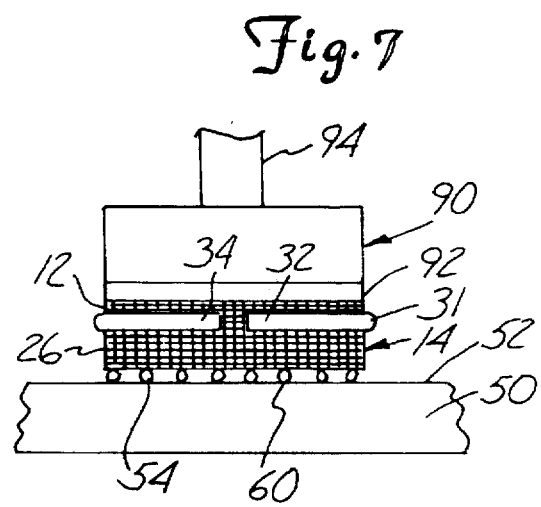
FIG. 7 is a side view of a wicking system of the present invention in use with an electric heater.

An alternative method of the present invention employs the wicking system 10 with an electric heater instead of a hot gas flow system. As shown in FIG. 7, the carrier 12 of the wicking system 10 is connected to an electric heater 90 via an adhesive 92. To remove the solder 60 from the printed wire board 50 using the wicking system 10 with the electric heater 90, the printed wire board 50 is prebaked at about 90° C. to 110° C. for about 4 hours as previously described and maintained at this temperature to remove all excess moisture. Flux is then applied to the metal fabric 14 of the wicking system 10. Flux can also be applied to the connecting surface 52 of the printed wire board 50 if desired.

Next, the electric heater 90, with the wicking system 10 secured thereto by releasable clip-on retainer 31, is moved adjacent the connecting surface 52 over conductive surface pads 54 into the position shown in FIG. 7. The heater 90 heats the metal fabric 14 to a temperature of about 375° C. to 400° C. The wicking system 10 (shown in FIG. 4) is directed onto the printed wire board 50 by moving the shaft 94 of the electric heater 90 so that the metal fabric 14 is in contact with the connecting surface 52 of the printed wire board 50. The hot metal fabric 14 contacts and melts the solder 60 causing the solder 60 to flow onto and adhere to the metal fabric 14. While the metal fabric 14 is still hot, the electric heater 90 is moved away from the surface 52 of the printed wire board 50 thereby removing the wicking system 10 from the connecting surface 52 of the printed wire board 50. Any excess solder 60 that has not flowed onto the metal fabric 14 by this time will wick onto the metal fabric 14 as the metal fabric 14 is moved away from the connecting surface 52. In a final step, the metal fabric 14 is removed from the carrier 12 by removing the clip-on retainer 31 so that a new metal fabric can be installed for future use.

While either method of using the wicking system 10 (hot gas reflow or electric heater) can be used to remove solder from a conductive surface of a printed wire board, the hot gas flow method is preferred when the solder removing method is carried out as part of a method of replacing a microelectric component such as an AGA chip on a printed wire board. Specifically, in such a method an old AGA chip can be removed from a printed wire board and replaced with new AGA chip. To make this exchange efficient, it is preferred that a single system be used to both remove the old AGA chip and install the new AGA chip.

The electric heater method is undesirable for melting solder for mounting new AGA chips since the electric heater would transmit conductive heat through the new AGA chip at temperatures sufficient to destroy the viability of the new AGA chip. Accordingly, while the electric heater 90 can be used to remove old AGA chips and remove the solder 60 from the connecting surface 52 of the printed wire board 50, the electric heater 90 is not suitable for use in mounting a new AGA chip.

On the other hand, a hot gas flow method can be used to remove an old AGA chip, remove solder, and mount a new AGA chip. As previously discussed, the hot gas flow causes the solder to heat to a temperature (e.g., 240° C.) sufficient to cause reflow of solder allowing an old AGA chip to be removed from a connecting surface of a printed wire board and sufficient to permit solder to wick onto the metal fabric of wicking system 10. In addition, the temperatures introduced at the connection site of the solder by the hot gas method are sufficient to cause flow of solder when mounting a new AGA chip without conductively transmitting heat through the new AGA chip. This maintains the viability of the new AGA chip.

This difference between the hot gas flow and electric heater methods is significant since rework of AGA chips on printed wire boards typically occurs in an assembly line process in which the system used to remove an old AGA chip is also used to mount a new AGA chip and must do so without damaging the new chip. This is not possible with the electric heater method. Accordingly, the hot gas flow method is a preferred method for removing solder from a connecting surface of a printed wire board since the hot gas flow method can be used (in association with a vacuum system) to also cause solder reflow for a new AGA chip being mounted on the connecting surface of the printed wire board, without causing heat damage to the new AGA chip.

Figure 8:
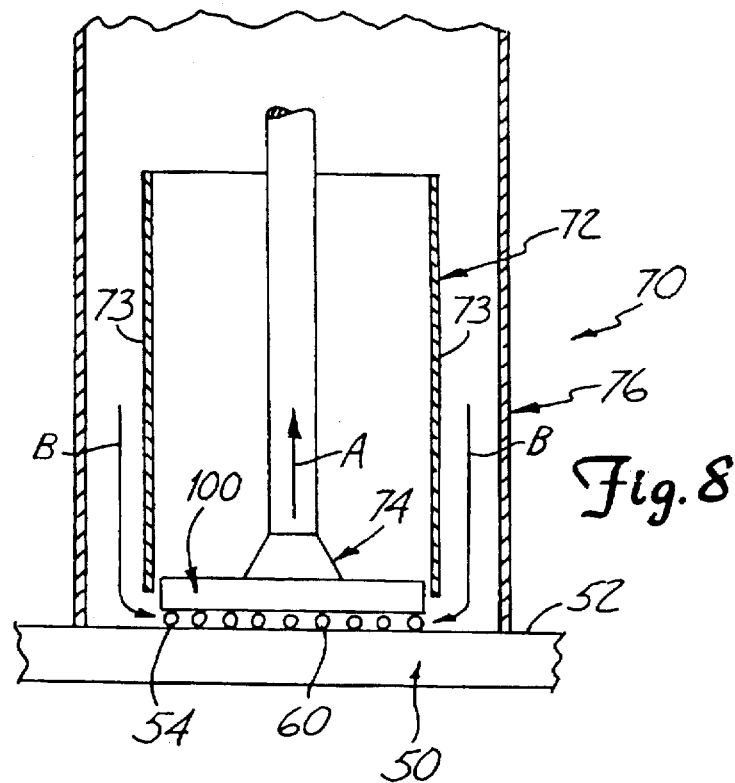
FIG. 8 is a side plan view of a hot gas rework nozzle in use during removal of an area grid array chip from a printed wire board.

In a method of replacing a microelectronic component such as an AGA chip on a printed wire board, an existing AGA chip 100 must first be removed. First, the printed wire board 50 must be pre-baked as previously described to remove all excess moisture from the board 50. The gas rework system 70 is then moved onto the connecting surface 52 of the printed wire board 50 into the position shown in FIG. 8. The vacuum system 72 is activated so that the vacuum nozzle 74 releasably holds the AGA chip 100 and the hot gas nozzle 76 is activated causing the solder 60 to reach a temperature of about 240° C. so that the solder 60 is molten. With the solder 60 in a molten state, the hot gas rework system 70 is moved away from the connecting surface 52 of the printed wire board 50 causing the AGA chip 100 to be lifted off the conductive surface pads 54 of the printed wire board 50. The hot gas rework system 70 is further manipulated to discard the old AGA chip 100 from the vacuum nozzle 74 at location remote from the printed wire board 50 in a manner known to those skilled in the art.

Next, solder 60 remaining on the conductive surface pads 54 of the connecting surface 52 of the printed wire board 50 (e.g., see FIG. 5) must be removed. This is preferably accomplished with a wicking system 10 of the present invention and a hot gas rework system 70 as previously described in association with FIGS. 5 and 6. After the solder removal step, the laminate carrier 12 and metal fabric 14 of the wicking system 10 are discarded to free the vacuum nozzle 74 of the rework system 70 for future use.

Figure 9:
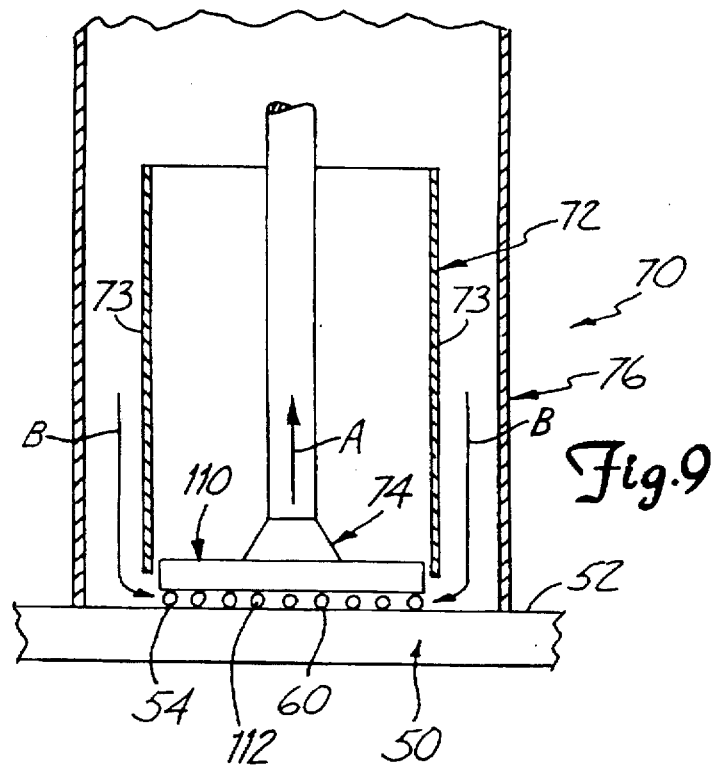
FIG. 9 is a side plan view of a hot gas rework nozzle in use during mounting of an area grid array chip on a printed wire board.

Next, a new AGA chip 110 can be installed on the printed wire board 50. Typically, the AGA chip will have solder balls 112 (e.g. having the appearance of the solder 60 as shown in FIG. 6) mounted to the conductive surface pads of the AGA chip and is therefore referred to as a ball grid array (BGA) chip. Specifically, the new BGA chip 110 is maneuvered at a location remote from the printed wire board 50 to be securely held by the vacuum nozzle 74. The rework system 70 is then moved toward and onto the connecting surface 52 of the printed wire board 50 into the position shown in FIG. 9 so that the solder balls 112 attached on the BGA chip 110 contact the conductive surface pads 54 of the printed wire board 50. While in this position, the hot gas nozzle 76 of the rework system 70 is activated causing hot gas to flow along the direction noted by the arrow B. This hot gas melts the solder balls 112 causing an electrical connection to be established between the respective conductive surface pads of the ball grid array chip and the conductive surface pads 54 of the printed wire board 50. After the electrical connection has been made, the hot gas nozzle 76 is deactivated and the vacuum nozzle is deactivated. The rework system 70 is then moved away from the connecting surface 52 of the printed wire board 50 leaving the new BGA chip 110 mounted on the printed wire board 50.

The wicking system and method of the present invention have several advantages and features. Foremost, the wicking system of the present invention permits complete and thorough removal of solder from the conductive surfaces of a microelectronic component or a printed wire board. The wicking system is releasably securable to a hot gas rework system or an electric heater so that a wicking system can be readily disposed after a single use and a new wicking system can be easily installed for the next solder removal job. A disposable wicking system of the present invention takes the form of a metal fabric banded to a laminate carrier or a metal fabric secured to a metal or ceramic carrier by a releasable clip-on retainer. The wicking system of the present invention is particularly useful with a hot gas rework system in a method of replacing a microelectronic component such as a AGA chip on a printed wire board since the laminate carrier of a wicking system of the present invention can be readily handled by a vacuum nozzle of the rework system. The wicking system of the present invention avoids the necessity of manually removing solder from an array of conductive surface pads of a printed wire board as was required with the conventional heater solder tip and wick method of removing solder.

Although the present invention has been described with reference to preferred embodiments, workers skilled in the art will recognize that changes may be made in form and detail without departing from the spirit and scope of the invention.

What is claimed is:

1. A wicking system for use in removing solder from an array of conductive surface pads of a microelectronic component, the system comprising:

a carrier made of at least one of a ceramic material and a metal material, the carrier having a rectangular shape with a first surface, a second surface, and four sides, the first surface having a size and shape substantially the same as a size and shape of the array of conductive surface pads of the microelectronic component;

a metal fabric having a first surface, a second surface, and an outer edge, the first surface having a size and shape slightly greater than the size and shape of the first surface of the carrier such that the outer edges of the fabric are capable of being folded to extend upwardly parallel to the sides of the carrier; and an elongate deformable retainer clip releasably securable about the sides of the carrier and capable of securely holding the outer edges of the fabric against the sides of the carrier.

2. A wicking system for removing solder from an array of conductive surface pads on a printed wire board comprising:

a carrier having a generally rectangular shape with a first surface and a second surface, the first surface sized and shaped to have substantially the same size and shape as the array of conductive surface pads on the printed wire board; and a metal fabric having a first surface and a second surface, the first surface being sized and shaped to have substantially the same size and shape as the array of conductive surface pads of the printed wire board, wherein the second surface of the metal fabric is bonded to the second surface of the carrier with at least one of an adhesive bond and a high temperature solder bond.

3. The wicking system of claim 2 wherein an outer edge of the metal fabric is sized and shaped to be substantially coterminus with an outer edge of the carrier.

4. The wicking system of claim 3 wherein the metal fabric consists of a single layer sheet.

5. The wicking system of claim 4 wherein the carrier is made of a non-metal laminate material.

6. The wicking system of claim 5 wherein the laminate material includes an epoxy glass material.

7. The wicking system of claim 5 wherein the metal fabric consists of a single layer sheet.

8. The wicking system of claim 5 wherein the carrier is made of a non-metal laminate material.

9. A wicking system for use in removing solder from an array of conductive surface pads on a printed wire board, the system comprising:

a carrier made of at least one of a ceramic material and a metal material, the carrier having a rectangular shape with a first surface, a second surface, and four sides, the first surface having a size and shape substantially the same as a size and shape of the array of conductive surface pads on the printed wire board;

a metal fabric having a first surface, a second surface, and an outer edge, the first surface having a size and shape slightly greater than the size and shape of the first surface of the carrier such that the outer edges of the fabric are capable of being folded to extend upwardly parallel to the sides of the carrier; and an elongate deformable retainer clip releasably securable about the sides of the carrier and capable of securely holding the outer edges of the fabric against the sides of the carrier.

10. A wicking system for removing solder from an array of conductive surface pads of a microelectric component comprising:

a carrier having a generally rectangular shape with a first surface and a second surface, the first surface sized and shaped to have substantially the same size and shape at the array of conductive surface pads of the microelectric component; and a metal fabric having a first surface and a second surface, the first surface being sized and shaped to have substantially the same size and shape as the array of conductive surface pads of the microelectric component, wherein the second surface of the metal fabric is bonded to the second surface of the carrier with at least one of an adhesive bond and a high temperature solder bond.

* * * * *

UNITED STATES PATENT AND TRADEMARK OFFICE
CERTIFICATE OF CORRECTION

PATENT NO. : 5,746,367
DATED : MAY 5, 1998
INVENTOR(S) : DEEPAK KESHAV PAI, LOWELL DENNIS LUND

It is certified that error appears in the above-indentified patent and that said Letters Patent is hereby corrected as shown below:

Col. 7, line 22, delete "claim 5", insert --claim 2--

Col. 7, line 24, delete "claim 5", insert --claim 2--

Signed and Sealed this

Seventeenth Day of November, 1998

Attest:

BRUCE LEHMAN

Attesting Officer    Commissioner of Patents and Trademarks